United States Patent
Noda et al.

(10) Patent No.: US 8,546,909 B2
(45) Date of Patent: Oct. 1, 2013

(54) NONVOLATILE SEMICONDUCTOR MEMORY DEVICE HAVING AIR GAP PROXIMATE TO ELEMENT ISOLATION REGION AND METHOD OF MANUFACTURING THE SAME

(75) Inventors: Mitsuhiko Noda, Yokohama (JP);
Hiroyuki Kutsukake, Yokohama (JP);
Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 52 days.

(21) Appl. No.: 13/234,644

(22) Filed: Sep. 16, 2011

(65) Prior Publication Data
US 2012/0193698 A1 Aug. 2, 2012

(30) Foreign Application Priority Data

Jan. 31, 2011 (JP) ................................. 2011-019058

(51) Int. Cl.
*H01L 21/70* (2006.01)
*H01L 29/788* (2006.01)
*H01L 29/792* (2006.01)
*H01L 23/58* (2006.01)
*H01L 21/76* (2006.01)

(52) U.S. Cl.
USPC ........... 257/522; 257/316; 257/326; 257/506; 257/510; 257/647; 257/E29.3; 257/E21.19; 438/421; 438/422

(58) Field of Classification Search
USPC .................................. 438/421, 422
See application file for complete search history.

(56) References Cited

U.S. PATENT DOCUMENTS

| | | | |
|---|---|---|---|
| 5,903,040 A | 5/1999 | Hong | |
| 7,462,905 B2 | 12/2008 | Imai et al. | |
| 8,008,149 B2 | 8/2011 | Kuniya | |
| 8,071,449 B2 | 12/2011 | Aoyama et al. | |
| 8,148,789 B2 | 4/2012 | Kito et al. | |
| 2003/0197223 A1 | 10/2003 | Miyamoto et al. | |
| 2007/0063256 A1 | 3/2007 | Imai et al. | |
| 2007/0184615 A1 | 8/2007 | Brazzelli et al. | |
| 2007/0257305 A1 | 11/2007 | Sasago et al. | |
| 2008/0283898 A1 | 11/2008 | Kuniya | |
| 2009/0096007 A1* | 4/2009 | Omura et al. ................. 257/316 |

(Continued)

FOREIGN PATENT DOCUMENTS

JP 11-16998 1/1999

OTHER PUBLICATIONS

Search and Examination Report issued Sep. 21, 2012 in Singapore Patent Application No. 201106628-9 (English Translation only).

*Primary Examiner* — Michael Jung
(74) *Attorney, Agent, or Firm* — Oblon, Spivak, McClelland, Maier & Neustadt, L.L.P.

(57) ABSTRACT

According to one embodiment, a nonvolatile semiconductor memory device includes an element region, a gate insulating film, a first gate electrode, an intergate insulating film, a second gate electrode and an element isolation region. The gate insulating film is formed on the element region. The first gate electrode is formed on the gate insulating film. The intergate insulating film is formed on the first gate electrode and has an opening. The second gate electrode is formed on the intergate insulating film and in contact with the first gate electrode via the opening. The element isolation region encloses a laminated structure formed by the element region, the gate insulating film, and the first gate electrode. The air gap is formed between the element isolation region and side surfaces of the element region, the gate insulating film and the first gate electrode.

16 Claims, 6 Drawing Sheets

(56) References Cited

U.S. PATENT DOCUMENTS

| | | |
|---|---|---|
| 2009/0108333 A1 | 4/2009 | Kito et al. |
| 2009/0218614 A1 | 9/2009 | Aoyama et al. |
| 2010/0221904 A1 | 9/2010 | Brazzelli et al. |
| 2011/0062509 A1* | 3/2011 | Kato et al. .................... 257/324 |
| 2012/0037974 A1* | 2/2012 | Koyama ........................ 257/321 |

* cited by examiner

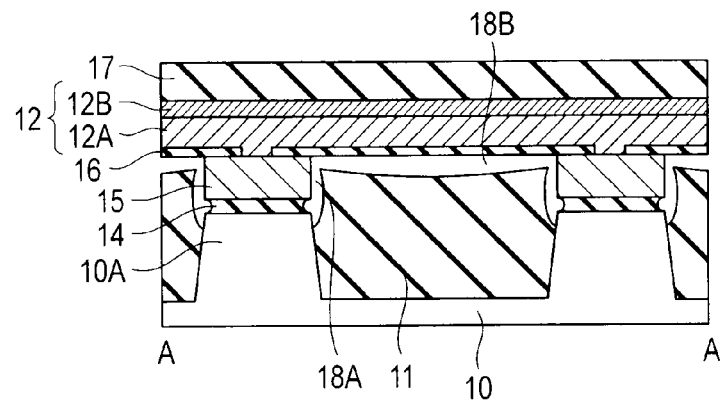
F I G. 6
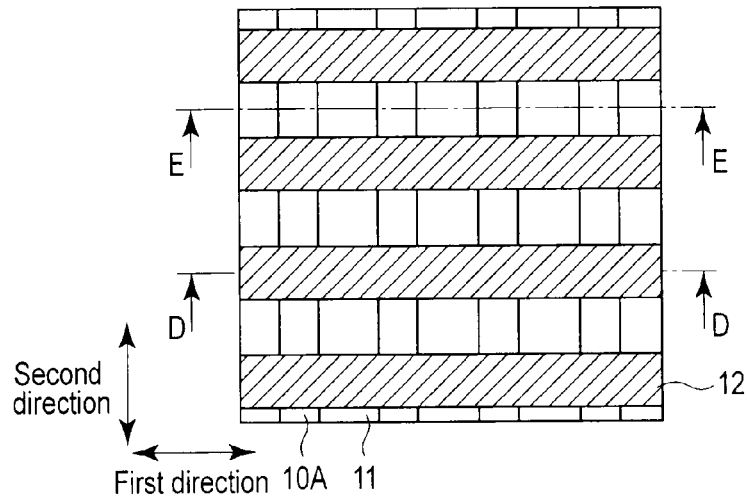
F I G. 7
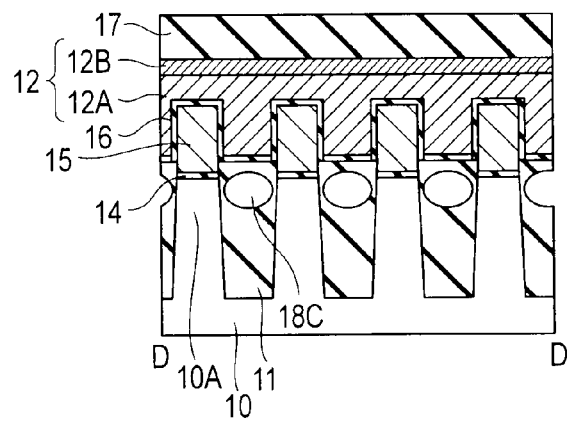
F I G. 8

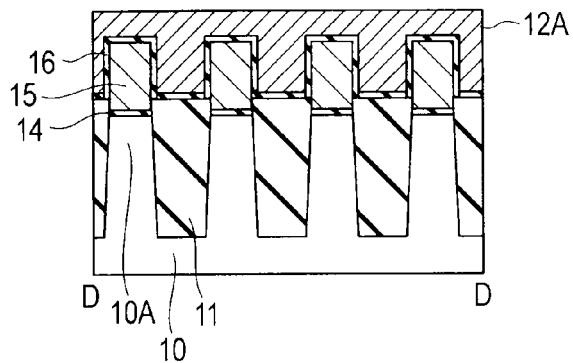
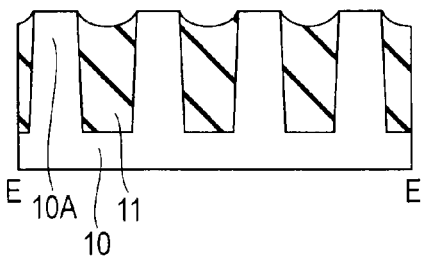
FIG. 16A          FIG. 16B
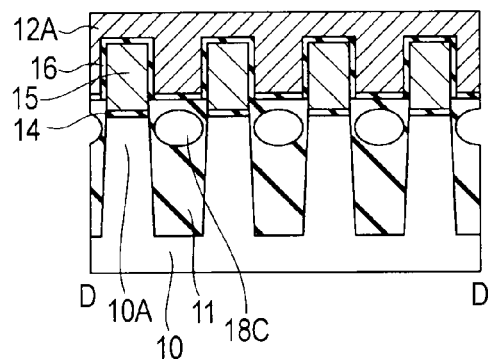
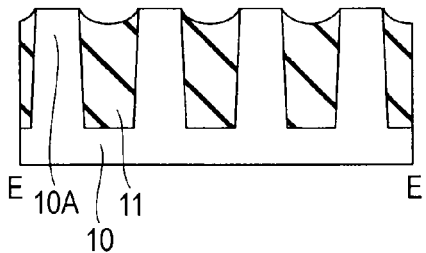
FIG. 17A          FIG. 17B
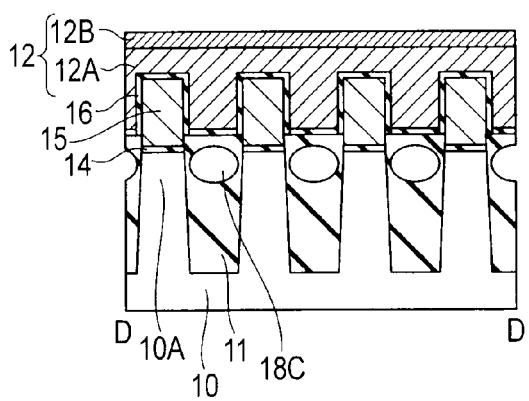
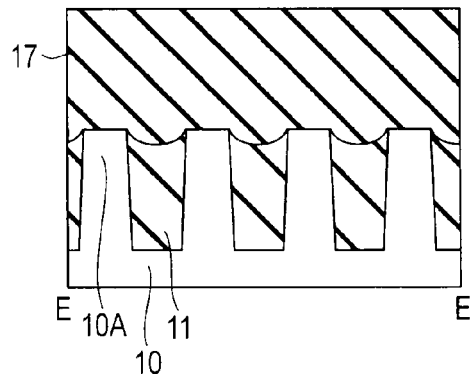
FIG. 18A          FIG. 18B

US 8,546,909 B2

NONVOLATILE SEMICONDUCTOR MEMORY DEVICE HAVING AIR GAP PROXIMATE TO ELEMENT ISOLATION REGION AND METHOD OF MANUFACTURING THE SAME

CROSS-REFERENCE TO RELATED APPLICATIONS

This application is based upon and claims the benefit of priority from prior Japanese Patent Application No. 2011-019058, filed Jan. 31, 2011, the entire contents of which are incorporated herein by reference.

FIELD

Embodiments described herein relate generally to a nonvolatile semiconductor memory device and a method of manufacturing the same.

BACKGROUND

In a nonvolatile semiconductor memory device having a structure having floating gates in a charging storage layer such as a NAND flash memory, the size of a peripheral transistor formed in a peripheral circuit portion is required to be reduced according to shrink trend of a memory cell unit.

When the width of the peripheral transistor is reduced, the peripheral transistor is largely affected by a parasitic transistor formed at an end portion of an element region (active area) arranged in proximity to an element isolation region, and this brings about a decrease of a threshold value and an increase of an off-leakage current caused by the decrease of the threshold value. The reason why the parasitic transistor is formed at the end portion of the element region is considered to be caused by mainly fixed charges in insulating film embedded within the element isolation region and charging to the element isolation region during manufacturing process.

BRIEF DESCRIPTION OF THE DRAWINGS

FIG. 6 is a cross-sectional view illustrating a peripheral transistor in a NAND flash memory according to a modification of the embodiment;

FIG. 7 is a plan view illustrating a memory cell unit in the NAND flash memory according to the embodiment;

FIGS. 8 and 9 are cross-sectional views illustrating the memory cell unit in the NAND flash memory according to the embodiment;

FIGS. 16A, 16B, 17A, 17B, 18A, 18B are cross-sectional views illustrating a method of manufacturing the memory cell unit in the NAND flash memory according to the embodiment.

DETAILED DESCRIPTION

Figure 1:
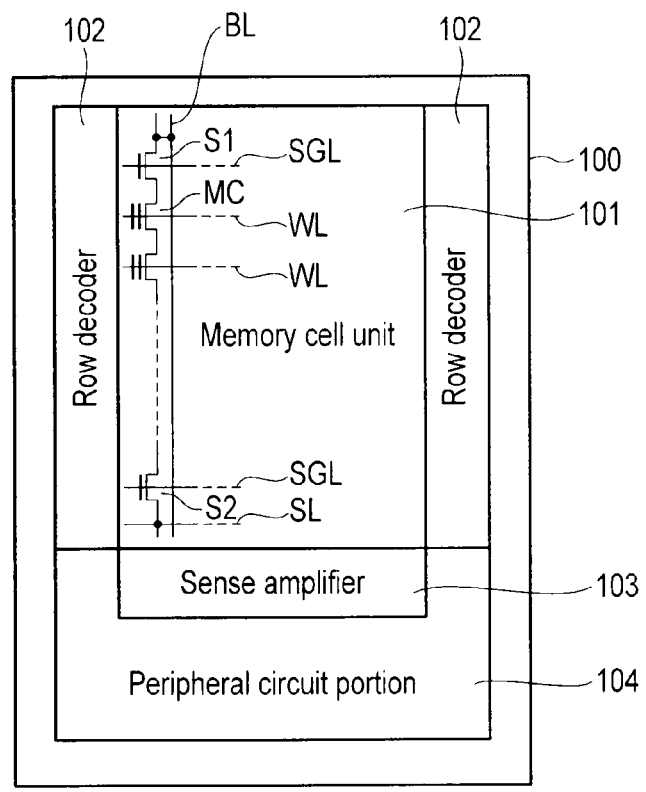
FIG. 1 is a layout diagram illustrating a NAND flash memory according to an embodiment.

A nonvolatile semiconductor memory device according to an embodiment and a manufacturing method thereof will be hereinafter explained with reference to the drawings. In this case, a NAND flash memory will be explained as an example of a nonvolatile semiconductor memory device. In the following description, constituent elements having approximately the same function and configuration are denoted with the same reference numerals, and repeated explanation thereabout will be made only when it is necessary.

In general, according to one embodiment, a nonvolatile semiconductor memory device includes a first element region, a first gate insulating film, a first gate electrode, a first intergate insulating film, a second gate electrode and a first element isolation region. The first element region is formed in a semiconductor substrate. The first gate insulating film is formed on the first element region. The first gate electrode is formed on the first gate insulating film. The first intergate insulating film is formed on the first gate electrode and has an opening. The second gate electrode is formed on the first intergate insulating film and in contact with the first gate electrode via the opening. The first element isolation region encloses a laminated structure formed by the first element region, the first gate insulating film, and the first gate electrode. A first air gap is formed between the first element isolation region and a side surface of the first element region, a side surface of the first gate insulating film, and a side surface of the first gate electrode.

[1] Structure of NAND Flash Memory

FIG. 1 is a layout diagram illustrating a NAND flash memory according to an embodiment.

As shown in FIG. 1, a NAND flash memory 100 includes a memory cell unit 101, a row decoder 102, a sense amplifier 103, and a peripheral circuit portion 104. In FIG. 1, row decoders 102 are arranged at both ends (right and left ends) of the memory cell unit 101, and a sense amplifier 103 is provided at a lower end of the memory cell unit 101. Further, at a lower side of the sense amplifier 103, a peripheral circuit portion 104 is provided.

The memory cell unit 101 includes a plurality of NAND cell units arranged in a matrix form. The NAND cell units include a plurality of memory cell transistors (hereinafter referred to as memory cells) MC connected in series and selection gate transistors S1, S2 connected to both ends of the plurality of memory cells MC so as to sandwich the plurality of memory cells MC. The memory cell MC is made of a nonvolatile memory cell transistor including a floating gate electrode and a control gate electrode.

One end of the NAND cell unit is connected to a bit line BL via a selection gate transistor S1, and the other end of the NAND cell unit is connected to a common source line SL via a selection gate transistor S2. The control gate electrode of the memory cell MC in the same row are connected to the word line WL. The control gate electrodes of selection gate transistors S1, S2 are respectively connected to selection gate lines SGL.

The row decoder 102 selects a particular word line WL, on the basis of an address, from a plurality of word lines WL connected to the memory cell MC in the memory cell unit 101. The sense amplifier 103 reads data stored in the memory cell MC from the bit line BL connected to the memory cell MC. The peripheral circuit portion 104 reads a circuit including a transistor (hereinafter referred to as a peripheral transistor) for writing, reading, and erasing operation performed on the memory cell MC in the memory cell unit 101.

First, the structure of the peripheral transistor of the peripheral circuit portion 104 will be explained, and subsequently, the structure of the memory cell unit 101 will be explained. In this explanation, the structure of the peripheral transistor included in the peripheral circuit portion 104 will be explained. However, the transistor including the row decoder 102 and the sense amplifier 103 have the same structure.

[1-1] Peripheral Transistor

Figure 2:
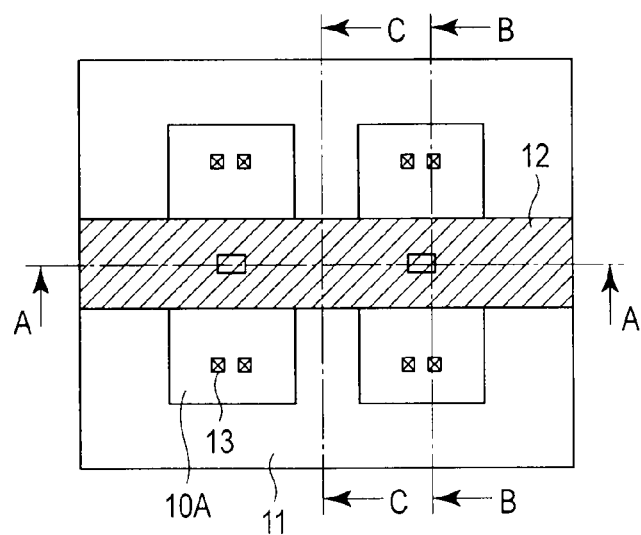
FIG. 2 is a plan view illustrating peripheral transistors in the NAND flash memory according to the embodiment.

FIG. 2 is a plan view illustrating peripheral transistors included in the peripheral circuit portion in the NAND flash memory according to the embodiment.

As shown in FIG. 2, element regions (active areas) 10A isolated by an element isolation insulating region 11 are provided on a semiconductor substrate. In the element region 10A, a transistor is formed. Further, a gate electrode 12 is arranged on the element region 10A. Contact plugs 13 are connected to the element region 10A at both sides of the gate electrode 12.

Figure 3:
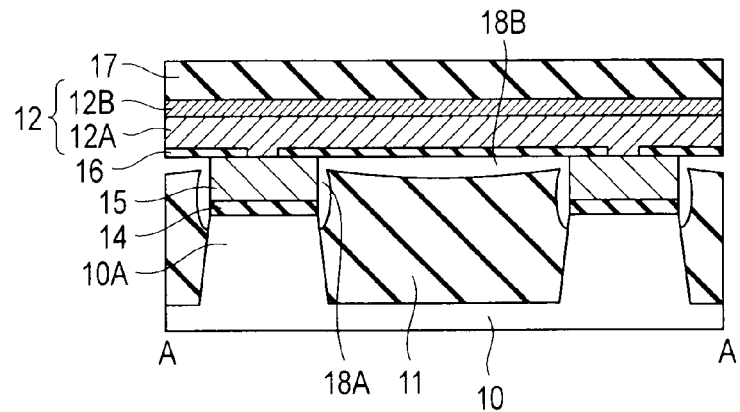
FIGS. 3 and 4 are cross-sectional views illustrating the peripheral transistor in the NAND flash memory according to the embodiment.
Figure 4:
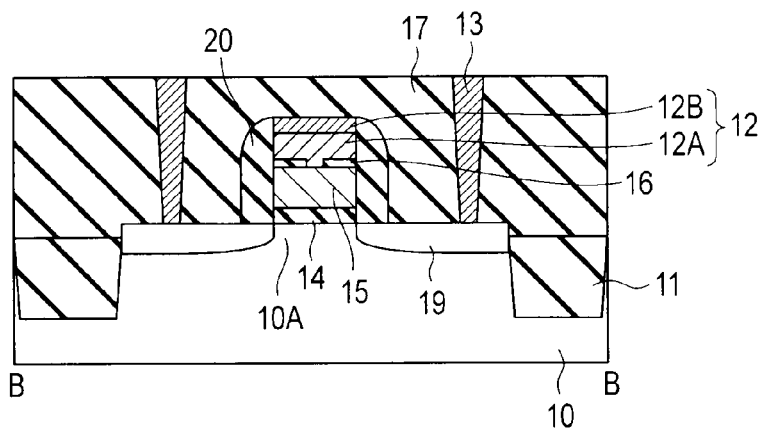
Figure 5:
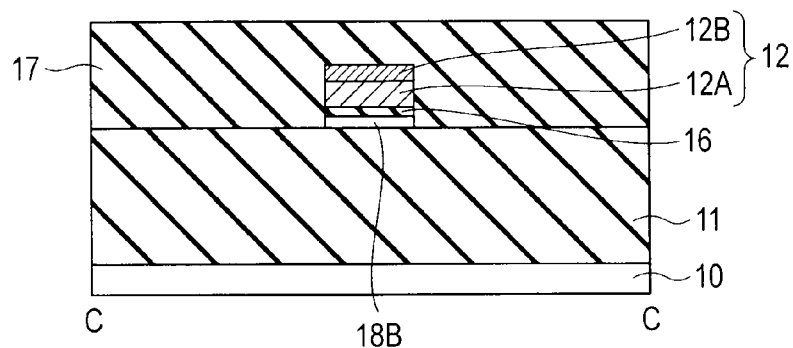
FIG. 5 is a cross-sectional view of a element isolation insulating region between peripheral transistors in the NAND flash memory according to the embodiment.

FIGS. 3 and 4 are cross-sectional views illustrating the peripheral transistor in the NAND flash memory. FIG. 3 is a cross section taken along line A-A (direction of the gate width) of FIG. 2. FIG. 4 is a cross section taken along line B-B (direction of the gate length) of FIG. 2. FIG. 5 is a cross-sectional view of the element isolation insulating region 11 between the peripheral transistors, and is the cross-sectional view taken along line C-C (direction of the gate length) of FIG. 2.

As shown in FIGS. 3 and 4, the element regions 10A isolated by the element isolation insulating region 11 are formed on the semiconductor substrate 10. A gate insulating film 14 is formed on the element region 10A. A first gate electrode 15 is formed on the gate insulating film 14, and an intergate insulating film 16 is formed on the first gate electrode 15. A second gate electrode 12 is formed on the intergate insulating film 16, and further, an interlayer insulating film 17 is formed on the second gate electrode 12.

For example, the semiconductor substrate 10 is made of silicon. For example, the element isolation insulating region 11 is made of shallow trench isolation (STI). The STI is made by embedding insulating films (such as silicon oxide films) into grooves arranged in the surface region of the semiconductor substrate 10. For example, the gate insulating film 14 and the interlayer insulating film 17 are made of silicon oxide films, for example.

For example, the first gate electrode 15 is made of, e.g., a polysilicon film and a metal film. The intergate insulating film 16 is made of, e.g., an ONO film, or a NONON film, a NOAON film, a film having a high dielectric constant (high-k layer) such as a metal oxide film. In this case, O denotes a silicon oxide film, N denotes a silicon nitride film or silicon oxynitride film, and A denotes an aluminum oxide film. For example, the ONO film indicates a laminated film obtained by laminating a silicon oxide film/a silicon nitride film/a silicon oxide film in this order.

The second gate electrode 12 includes, e.g., a polysilicon film 12A and a silicide film 12B which are laminated. Examples of silicide films include Ni silicide and Co silicide. The numeral 12B may be a metal film such as W. Further, opening portions are formed in the intergate insulating film 16 between the first gate electrode 15 and the second gate electrode 12. The first gate electrode 15 and the second gate electrode 12 are electrically connected through the opening portion.

As shown in FIG. 3, the element isolation insulating regions 11 are formed on side surfaces of the element regions 10A, side surfaces of the gate insulating films 14, and side surfaces of the first gate electrodes 15. Air gaps 18A are formed between the element isolation insulating regions 11 and the side surfaces of the element regions 10A, the side surfaces of the gate insulating films 14, and the side surfaces of the first gate electrodes 15. In other words, the element isolation insulating regions 11 are arranged on side surfaces of the element regions 10A, side surfaces of the gate insulating films 14, and side surfaces of the first gate electrodes 15 with air gaps 18A interposed therebetween. The depth of air gap 18A may reach the side surface of the element region 10A, and may not reach the bottom surface of the element isolation insulating film region 11. In other words, air gap 18A may be formed adjacent to end portions of the upper surface of the element region 10A.

As shown in FIGS. 3 and 5, the intergate insulating film 16 is formed above the element isolation insulating region 11 but under the second gate electrode 12. An air gap 18B is formed between the element isolation insulating region 11 and the intergate insulating film 16 (or the second gate electrode 12). In other words, the intergate insulating film 16 is formed above the element isolation insulating region 11 with air gap 18B interposed therebetween. The second gate electrode 12 is formed on the intergate insulating film 16, and the interlayer insulating film 17 is formed on the second gate electrode 12. Air gap 18B penetrates in the lengthwise direction of the of the second gate electrode 12 in the peripheral transistor.

Further, as shown in FIG. 4, source/drain diffusion layers 19 are formed in the element region at both sides of the first gate electrode 15. The contact plugs 13 connected to the source/drain diffusion layers 19 are formed in the interlayer insulating film 17 on the source/drain diffusion layer 19. Further, gate side wall insulating films 20 are formed on side surfaces of the gate insulating film 14, side surfaces of the first gate electrode 15, side surfaces of the intergate insulating film 16, and side surfaces of the second gate electrode 12. In the plan view as shown in FIG. 2, the gate side wall insulating film is omitted.

It should be noted that the first gate electrode 15 is formed according to the same steps and with the same materials as those of a floating gate electrode of the memory cell explained later. The second gate electrode 12 is formed according to the same steps and with the same materials as those of a control gate electrode of the memory cell explained later.

In the embodiments having the above structure, the air gap is formed in the element isolation insulating region (STI) 11 in the peripheral transistor of the NAND flash memory. Therefore, the embodiments achieve the following effects.

(1) Reduction of Effect of Parasitic Transistor (Edge Channel)

Fixed charges in the embedded materials such as an insulating film and charges produced during manufacturing process are accumulated in the element isolation insulating region. Accordingly, due to these charges, at the element region (active area) end portions, the threshold value of the peripheral transistor decreases, and an off-leakage current increases. Further, when the channel width size of the transistor is reduced, and the element region end portion is affected more significantly.

In the structure of the present embodiment, air gap 18A is formed between the element isolation insulating region 11 and the side surface of the gate insulating film 14/the side surface of the element region 10A. The relative permittivity of the silicon oxide film is about 3.9, and the relative permittivity of the silicon nitride film is about 7.0. In contrast, the relative permittivity of air is about 1.0. As described above, air gap 18A having low dielectric constant is formed in the element isolation insulating region in proximity to the end portions of the element region, so that the device is less affected by the fixed charges in the embedded materials. Therefore, this can suppress formation of an edge channel in the element region end portion. In other words, the device is less affected by the parasitic transistors formed in the element region end portions.

It should be noted that the air gap formed on the side surfaces of the gate insulating film 14 and the side surfaces of the element region 10A may not be necessarily formed along the entire region of the channel length. The above effects can be obtained by forming the air gap only in a portion of the entire channel length.

(2) Suppression of Field Inversion Leakage Due to Gate Voltage Shield Effect

In the structure as shown in FIG. 2 in which one gate electrode 12 is shared by adjacent transistor devices, the gate electrode 12 resides on the element isolation insulating region 11. This kind of structure can be considered as a quasi MOS transistor structure made in the semiconductor substrate 10, the gate electrode 12, the intergate insulating film 16, and the insulating film in the element isolation insulating region 11. In this kind of structure, an inversion layer is formed in the semiconductor substrate 10 by the potential of the gate electrode when a voltage is applied to the gate electrode 12. In the above structure, there is a possibility that an adjacent device leakage current (field inversion leakage) may be generated via this inversion layer.

In the structure according to the present embodiment, an air gap 18B having a low dielectric constant is formed under the gate electrode 12 but above the element isolation insulating region 11. That is, air gap 18B is disposed between the element isolation insulating region 11 and the gate electrode 12. Accordingly, this has an effect of suppressing formation of the inversion layer in the semiconductor substrate under the element isolation insulating region 11 due to the gate voltage, and suppressing the field inversion leakage.

The embodiment as shown in FIG. 3 may have a structure as shown in FIG. 6. FIG. 6 is a modification of the embodiment as shown in FIG. 3, and is a cross-sectional view of a peripheral transistor.

As shown in FIG. 6, the side surfaces of the gate insulating film 14 are recessed. As described in the manufacturing method explained later, this is because not only the element isolation insulating region 11 but also the side surfaces of the gate insulating film 14 may be etched in the step of forming the air gap. The structure other than the above is the same as the structure as shown in FIG. 3. In this kind of modification, the same actions and effects as those of the above embodiment can be obtained.

[1-2] Memory Cell Unit

FIG. 7 is a plan view illustrating the memory cell unit in a NAND flash memory according to the embodiment.

As shown in FIG. 7, a plurality of element regions 10A isolated by the element isolation insulating regions 11 are arranged in a first direction on the semiconductor substrate. The element region 10A extends in a second direction perpendicular to the first direction. A plurality of control gate electrodes (word lines) 12 are arranged in a second direction on the element region 10A and the element isolation insulating region 11. The control gate electrode 12 extends in the first direction.

FIG. 8 is a cross-sectional view illustrating a memory cell unit in the NAND flash memory, and is a cross section of the word line taken along line D-D (first direction) of FIG. 7.

As shown in FIG. 8, the element regions 10A isolated by the element isolation insulating regions 11 are formed on the semiconductor substrate 10. The gate insulating film 14 is formed on the element region 10A. The floating gate electrode 15 is formed on the gate insulating film 14, and the intergate insulating film 16 is formed on the floating gate electrode 15. The control gate electrode 12 is formed on the intergate insulating film 16, and the interlayer insulating film 17 is formed on the control gate electrode 12. Further, as shown in FIG. 8, an air gap 18C is formed in the element isolation insulating region 11 under the control gate electrode 12.

For example, the floating gate electrode 15 is made of a polysilicon film. The control gate electrode 12 includes, e.g., a polysilicon film 12A and a silicide film 12B which are laminated. The floating gate electrode 15 is formed according to the same steps and with the same materials as those of the first gate electrode 15 of the peripheral transistor. The control gate electrode 12 is formed according to the same steps and with the same materials as those of the second gate electrode 12 of the peripheral transistor.

Figure 9:
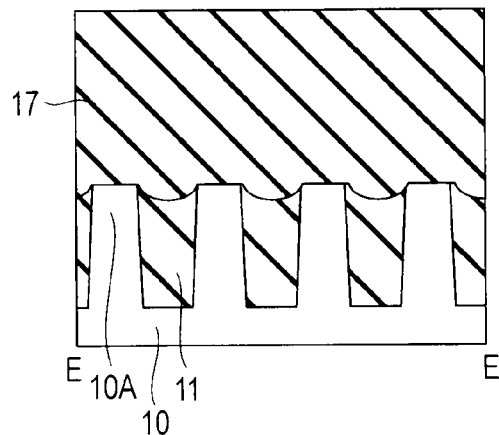

FIG. 9 is a cross-sectional view illustrating the memory cell unit in the NAND flash memory, and is a cross section of a region except the word line taken along line E-E (first direction) of FIG. 7.

As shown in FIG. 9, the element regions 10A isolated by the element isolation insulating regions 11 are formed on the semiconductor substrate 10. The upper surfaces of the element isolation insulating regions 11 are recessed. The interlayer insulating film 17 is formed on the element isolation insulating regions 11 and the element regions 10A.

[2] Method of Manufacturing NAND Flash Memory

A method of manufacturing the peripheral transistor and the memory cell unit will be explained as the method of manufacturing the NAND flash memory according to the embodiment.

[2-1] Method of Manufacturing Peripheral Transistor

Figure 10:
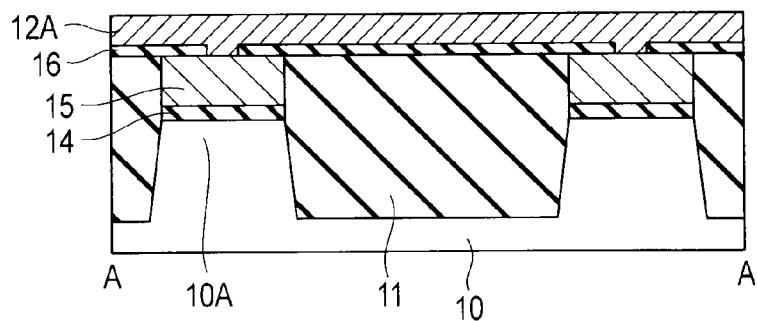
FIGS. 10-15 are cross-sectional views illustrating a method of manufacturing the peripheral transistor in the NAND flash memory according to the embodiment.
Figure 11:
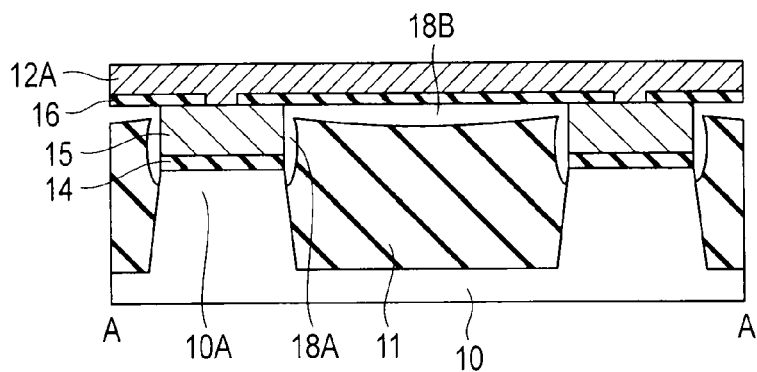
Figure 12:
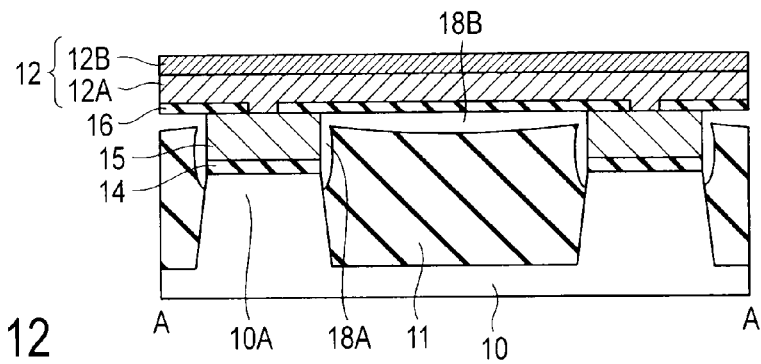
Figure 13:
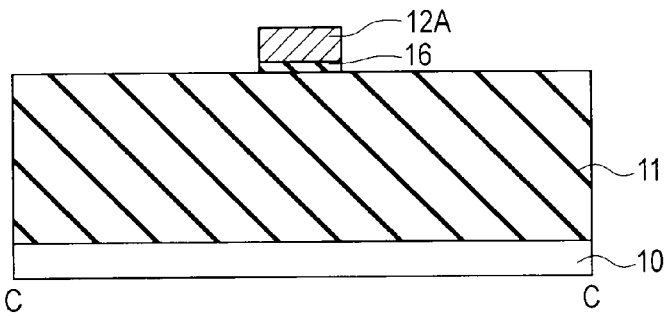
Figure 14:
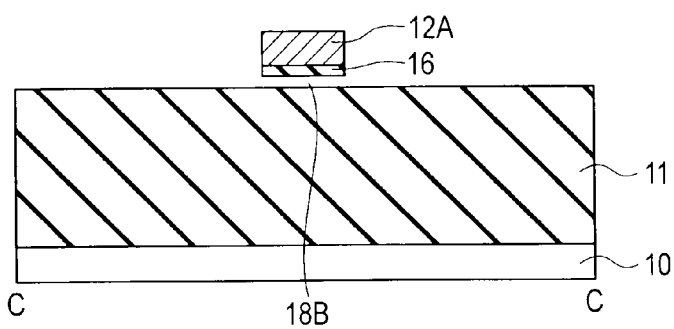
Figure 15:
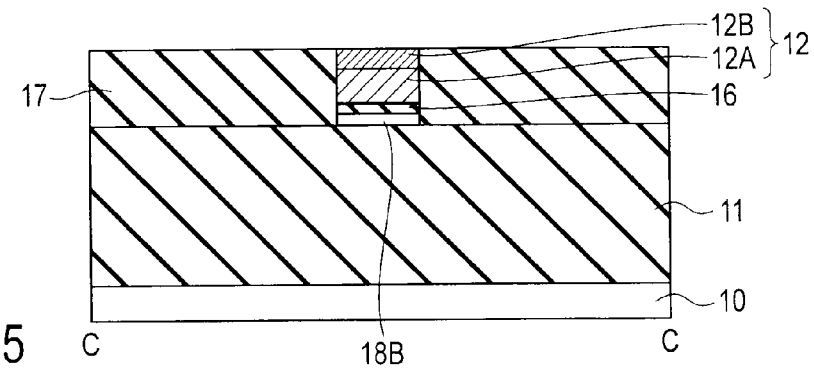

FIGS. 10, 11, 12, 13, 14, and 15 are cross-sectional views illustrating the method of manufacturing the peripheral transistor in the NAND flash memory. FIG. 10, FIG. 11, and FIG. 12 are cross sections taken along line A-A of FIG. 2. FIG. 13, FIG. 14, and FIG. 15 are cross sections taken along line C-C of FIG. 2.

As shown in FIG. 10, the gate insulating film 14 and the first gate electrode 15 are laminated on the semiconductor substrate 10 in order. Subsequently, a portion of the laminated structure is processed, so that the element region 10A is formed. Subsequently, the insulating film is embedded, so that the element isolation insulating region 11 sandwiching the element regions 10A is formed. Further, the intergate insulating film 16 is formed on the first gate electrode 15 and the element isolation insulating region 11. An opening is formed in a portion of the intergate insulating film 16 located above the first gate electrode 15, and thereafter the polysilicon film 12A is formed. Subsequently, the intergate insulating film 16 and the polysilicon film 12A are processed, so that a cross section as shown in FIG. 13 is obtained. That is, the element isolation insulating region 11 is formed on the semiconductor substrate 10, and then the intergate insulating film 16 and the polysilicon film 12A are formed in order on a portion of the element isolation insulating region 11.

Thereafter, using wet etching on the structure as shown in FIG. 10, the element isolation insulating region 11 is etched at the side surfaces of the first gate electrode 15, the side surfaces of the gate insulating film 14, and the side surfaces of the element region 10A. Accordingly, as shown in FIG. 11, air gap 18A is formed between the element isolation insulating region 11 and the side surfaces of the first gate electrode 15, the side surfaces of the gate insulating film 14, and the side surfaces of the element region 10A.

Further, with the above wet etching, the element isolation insulating region 11 under the intergate insulating film 16 is etched, and as shown in FIGS. 11 and 14, air gap 18B is formed between the element isolation insulating region 11 and the intergate insulating film 16.

Subsequently, as shown in FIGS. 12 to 15, the silicide film 12B is formed on the polysilicon film 12A. More specifically, a metal film is deposited on the polysilicon film 12A, and thermal treatment is performed so that the polysilicon film 12A and the metal film react with each other. Thereafter, the unreacted metal film is removed. As a result, the silicide film 12B is formed on the polysilicon film 12A. Examples of metal films include Ni, Ti, Co, Pt, Pd, Ta, Mo.

Thereafter, the interlayer insulating film 17 is formed on the semiconductor substrate 10 including the portion on the silicide film 12B. On this occasion, air gaps 18A, 18B are not filled with the interlayer insulating film 17 but are maintained as the air gaps. As described above, the peripheral transistor is manufactured.

In the above manufacturing method, the steps for forming the air gaps in the element isolation insulating region 11 are performed. In the steps for forming the air gaps, as shown in FIG. 4, the surface of the element isolation insulating region 11 is removed to a position lower than the surface of the element region (active area) 10A. This can reduce crystal defect occurring in the element region caused by stresses of the embedded materials in the element isolation insulating region 11. That is, the embedded materials have stresses unique to themselves, and the stresses are one of the causes generating crystal defect in the element region. According to the manufacturing method of the present embodiment, the element isolation insulating region 11 is removed by wet etching to a level lower than the element region 10A, and the manufacturing method of the present embodiment has an effect of suppressing occurrence of crystal defect caused by the stresses of the element isolation insulating film in the element region 10A.

[2-2] Method of Manufacturing Memory Cell Unit

FIGS. 16A, 16B, 17A, 17B, 18A, and 18B are cross-sectional views illustrating a method of manufacturing the memory cell unit in the NAND flash memory.

FIGS. 16A, 17A, 18A are cross-sectional views taken along line D-D of FIG. 7. FIGS. 16B, 17B, 18B are cross-sectional views taken along line E-E of FIG. 7.

As shown in FIGS. 16A, 16B, the element isolation insulating regions 11 and the element regions 10A isolated by the element isolation insulating regions 11 are formed on the semiconductor substrate 10.

First, as shown in FIG. 16A, the gate insulating film 14 and the floating gate electrode 15 are laminated on the semiconductor substrate 10 in order. Subsequently, a portion of the laminated structure is processed, so that the element region 10A is formed. Subsequently, the insulating film is embedded, so that the element isolation insulating region 11 sandwiching the element regions 10A is formed. Further, the intergate insulating film 16 and the polysilicon film 12A are formed in order on the floating gate electrodes 15 and the element isolation insulating regions 11. Subsequently, the floating gate electrode 15, the intergate insulating film 16, and the polysilicon film 12A are etched so that they extend in the first direction to make a word line. Wet etching is used for this etching. In this wet etching, the surfaces of the element isolation insulating regions 11 are etched and recesses are formed thereon as shown in FIG. 16B.

Thereafter, using wet etching on the structure as shown in FIGS. 16A, 16B, the element isolation insulating regions 11 are etched under the polysilicon film 12A. Accordingly, as shown in FIG. 17A, air gaps 18C are formed between the polysilicon film 12A and the element isolation insulating regions 11.

Thereafter, as shown in FIG. 18B, the interlayer insulating film 17 is deposited on the element regions 10A and the element isolation insulating regions 11. On this occasion, as shown in FIG. 18A, air gaps 18C are not filled with the interlayer insulating film 17 but are maintained as the air gaps.

Subsequently, as shown in FIG. 18A, the silicide film 12B is formed on the polysilicon film 12A. More specifically, a metal film is deposited on the polysilicon film 12A, and thermal treatment is performed so that the polysilicon film 12A and the metal film react with each other. Thereafter, the unreacted metal film is removed. As a result, the silicide film 12B is formed on the polysilicon film 12A. Examples of metal films include Ni, Ti, Co, Pt, Pd, Ta, Mo.

Thereafter, the interlayer insulating films, the contacts, and the wirings are formed according to a well-known method, so that the memory cell is manufactured.

It should be noted that the members denoted with the same reference numerals are formed with the same materials in the same steps in the above steps for manufacturing the peripheral transistor and the memory cell unit. Further, air gaps 18A, 18B and air gap 18C are formed in the same steps. It should be noted that air gaps 18A, 18B and air gap 18C may be formed in different steps.

In the present embodiment, the air gaps are formed in the element isolation regions (STIs) in the transistors formed in the peripheral circuit portion of the NAND flash memory. Therefore, this can suppress formation of the parasitic transistors due to the fixed charges in the element isolation regions, and further suppress deterioration of transistor characteristics when the widths of the transistors are reduced.

Further, the transistor structure including the air gap therein is formed in the element isolation region, whereby the element isolation region and the transistor are isolated. Accordingly, the device is less affected by the parasitic transistors, and the device size can be reduced while maintaining the transistor characteristics.

Further, this can reduce crystal defect caused by stresses of the embedded materials in the element isolation regions. Further, since there is an air gap in the element isolation region under the common gate between the transistors whose gates are the same, the field inversion withstand voltage can be improved.

According to the embodiment explained above, a nonvolatile semiconductor memory device capable of reducing the effect of the parasitic transistors formed at the end portions of the element regions of the transistors can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a first element region formed in a semiconductor substrate;
   a first gate insulating film formed on the first element region;
   a first gate electrode formed on the first gate insulating film;

a first intergate insulating film formed on the first gate electrode and having an opening;

a second gate electrode formed on the first intergate insulating film and in contact with the first gate electrode via the opening; and a first element isolation region that encloses a laminated structure formed by the first element region, the first gate insulating film, and the first gate electrode, wherein the first element isolation region is arranged on side surfaces of the first element region, the first gate insulating film and the first gate electrode with a first air gap interposed between the first element isolation region and the side surfaces.

2. The nonvolatile semiconductor memory device according to claim 1, wherein the second gate electrode is provided above the first element isolation region, and a second air gap is formed between the first element isolation region and the second gate electrode.

3. The nonvolatile semiconductor memory device according to claim 2, wherein the second air gap penetrates in direction of a gate length of the second gate electrode.

4. The nonvolatile semiconductor memory device according to claim 1, further comprising:

a plurality of second element regions formed in the semiconductor substrate;

a second gate insulating film formed on one of the second element regions;

a floating gate electrode formed on the second gate insulating film;

a second intergate insulating film formed on the floating gate electrode;

a control gate electrode formed on the second intergate insulating film; and a second element isolation region sandwiched between the second element regions and having a third air gap.

5. The nonvolatile semiconductor memory device according to claim 1, wherein a depth of the first air gap is shallower than a bottom surface of the first element isolation region.

6. The nonvolatile semiconductor memory device according to claim 1, wherein the first intergate insulating film includes a metal oxide film.

7. The nonvolatile semiconductor memory device according to claim 1, wherein the first intergate insulating film includes one of a laminated film including silicon oxide film/ silicon nitride film/silicon oxide film, a laminated film including silicon nitride film /silicon oxide film/silicon nitride film/ silicon oxide film/silicon nitride film, and a laminated film including silicon nitride film/silicon oxide film/aluminum oxide film/silicon oxide film /silicon nitride film.

8. The nonvolatile semiconductor memory device according to claim 1, wherein the first gate electrode includes at least one of a polysilicon film and a metal film.

9. The nonvolatile semiconductor memory device according to claim 1, wherein the second gate electrode includes at least one of a polysilicon film, a silicide film, and a metal film.

10. The nonvolatile semiconductor memory device according to claim 1, wherein the side surface of the first gate insulating film is recessed more greatly than the side surface of the first gate electrode.

11. A method of manufacturing a nonvolatile semiconductor memory device, comprising:

forming a first gate insulating film and a first gate electrode in order on a semiconductor substrate;

forming a first element region on the semiconductor substrate by etching the semiconductor substrate, the first gate insulating film, and the first gate electrode;

forming a first element isolation region enclosing the first element region, the first gate insulating film, and first gate electrode;

forming a first intergate insulating film and a second gate electrode in order on the first gate electrode and the first element isolation region; and etching the first element isolation region on a side surface of the first element region, a side surface of the first gate insulating film, and a side surface of the first gate electrode, and forming a first air gap between the first element isolation region and the side surface of the first element region, the side surface of the first gate insulating film, and the side surface of the first gate electrode, and the first air gap locating below the second gate electrode, wherein the first element isolation region is arranged on the side surfaces of the first element region, the first gate insulating film and the first gate electrode with the first air gap interposed between the first element isolation region and the side surfaces.

12. The method of manufacturing a nonvolatile semiconductor memory device according to claim 11, wherein forming the first air gap comprises forming an upper surface of the first element isolation region lower than an upper surface of the first element region in a gate length direction.

13. The method of manufacturing a nonvolatile semiconductor memory device according to claim 11, wherein forming the first air gap comprises forming an air gap between the first intergate insulating film and the first element isolation region.

14. The method of manufacturing a nonvolatile semiconductor memory device according to claim 11, further comprising:

forming a second gate insulating film and a floating gate electrode in order on the semiconductor substrate;

forming a second element region on the semiconductor substrate by etching the semiconductor substrate, the second gate insulating film, and the floating gate electrode;

forming a second element isolation region enclosing the second element region, the second gate insulating film, and the floating gate electrode;

forming a second intergate insulating film and a third gate electrode in order on the floating gate electrode and on the second element isolation region;

forming a word line by etching the floating gate electrode, the second intergate insulating film, and the third gate electrode; and forming a second air gap between the third gate electrode and the second element isolation region by etching the second element isolation region under the third gate electrode.

15. The method of manufacturing a nonvolatile semiconductor memory device according to claim 14, wherein the first air gap the second air gap are formed in the same step.

16. The method of manufacturing a nonvolatile semiconductor memory device according to claim 14, wherein the first air gap and the second air gap are formed in different steps.

* * * * *